United States Patent [19]

Lynch et al.

[11] Patent Number: 4,822,754
[45] Date of Patent: * Apr. 18, 1989

[54] FABRICATION OF FETS WITH SOURCE AND DRAIN CONTACTS ALIGNED WITH THE GATE ELECTRODE

[75] Inventors: William T. Lynch, Summit; Frederick Vratny, Berkeley, both of N.J.

[73] Assignee: American Telephone and Telegraph Company, AT&T Bell Laboratories, Murray Hill, N.J.

[*] Notice: The portion of the term of this patent subsequent to Jun. 12, 2001 has been disclaimed.

[21] Appl. No.: 619,892

[22] Filed: Jun. 12, 1984

Related U.S. Application Data

[63] Continuation-in-part of Ser. No. 498,897, May 27, 1983, Pat. No. 4,453,306.

[51] Int. Cl.[4] ............................................. H01L 21/225
[52] U.S. Cl. .................................... 437/193; 437/200; 437/162; 437/41; 437/984
[58] Field of Search ................. 29/571, 591; 156/628, 156/656, 657; 357/59; 148/188, DIG. 122; 437/193, 200, 162, 41, 984

[56] References Cited

U.S. PATENT DOCUMENTS 4,319,395 3/1982 Lund et al. ............................. 29/571
4,343,082 8/1982 Lepselter et al. .................. 29/576 B
4,453,306 6/1984 Lynch et al. .......................... 29/571

OTHER PUBLICATIONS

Proposed for publication in *IEEE Electron Device Letters:* "A New MOSFET Structure with Self-Aligned Polysilicon Source and Drain Electrodes," by D. S. Oh and C. Kim.

Primary Examiner—Brian E. Hearn
Assistant Examiner—T. N. Quach
Attorney, Agent, or Firm—Lester H. Birnbaum

[57] ABSTRACT

A method of fabricating FETs to reduce parasitics. Contact is made to the source and drain regions through a polycrystalline silicon runner which is aligned with the edge of the gate electrode. This is accomplished by providing a multi-level electrode structure including a gate electrode and depositing the polycrystalline silicon layer over the device. The polycrystalline silicon is rendered selectively removable in the portion overlying the gate electrode. When this portion is removed, the remaining polycrystalline is aligned with the gate.

3 Claims, 3 Drawing Sheets

FABRICATION OF FETS WITH SOURCE AND DRAIN CONTACTS ALIGNED WITH THE GATE ELECTRODE

CROSS-REFERENCE TO RELATED APPLICATION

This application is a continuation-in-part of my copending application, Ser. No. 498,897 filed May 27, 1983, now U.S. Pat. No. 4,453,306.

BACKGROUND OF THE INVENTION

This invention relates to the fabrication of integrated circuits and in particular to a fabrication sequence for field effect transistors which permits reduced parasitics in the final devices.

With the continuing trend of greater numbers of components in integrated circuits and the need for high speed operation, increasing demands are made on field effect transistors. In particular, as channel lengths become shorter and junctions become shallower, increasing attention must be paid to the device parasitics to insure optimum performance of the transistors. For example, the source and drain junction capacitances and the series resistances between the channel and the contacts to the source and drain regions can significantly affect performance in short channel FETs. Also, when FETs are used as memory cells in dynamic random access memories, the output of a cell will depend inversely on the capacitance of the bit line. Consequently, a reduction in the bit line capacitance, which is the sum of the junction capacitances associated with that bit line, will significantly increase the speed of the memory. Junction capacitances can be reduced by decreasing the area of the source and drain regions. However, this also creates problems in aligning the contacts to these regions. Decreasing source and drain junction depths also increase the series resistance between the source and drain contacts and the channel. This resistance can be reduced by better alignment of the contacts so that they extend close to the channel region.

Other proposals for fabricating FETs have included deposition of a metal such as Pt onto the surfaces of the source and drain regions utilizing a gate electrode as a mask. The metal is then reacted with the exposed silicon to form metal silicide contacts and gates which are self-aligned. Unreacted metal over the silicon oxide (masking) areas is etched away without affecting the silicide. External contact is then provided by an aluminum metalization deposited onto a patterned insulating layer which includes openings over the source, drain and gate silicide regions (see, e.g., U.S. Pat. No. 4,319,395 issued to Lund et al and U.S. Pat. No. 4,343,082 issued to Lepselter et al). Although such techniques are adequate to reduced series resistance, they do not lend themselves easily to reductions in the area of source and drain regions since the openings in the insulating layer for external contact must be aligned within the source and drain areas. Further, direct contact of the silicide regions by the aluminum metal over the source and drain regions can result in spiking, which is a shorting of the junction caused by reaction of aluminum with the underlying silicon substrate. This problem is particularly acute for shallow junctions. In addition, for CMOS devices, where the metal layer must contact both n+ and p+ junction areas, there are additional constraints in that the metal should not affect the ohmic contact to either conductivity type regions.

Reduced source and drain areas will also aid in reducing the possibility of latchup in CMOS circuits. That is, increased separation is permitted between the adjacent edges of the n+ emitter in the p-type tub and the p+ emitter in the n-type tub without changing the layout area. Alternatively, smaller source and drain areas permit the layout area to be reduced while maintaining the separation of the adjacent edges of the same n+ and p+ emitters.

It is therefore a primary object of the invention to provide a method of producing small area, low capacitance source and drain regions with a means of contacting such regions so that the contacts are selfaligned with the gate electrode. It is a further object of the invention to provide contacts to the source and drain regions which do not lead to spiking.

SUMMARY OF THE INVENTION

These and other objects of the invention are achieved in accordance with the invention which is a method of fabricating a field effect transistor including a source and drain region formed in the surface of a semiconductor substrate with a channel region therebetween. Formed over the channel region is a patterned multilevel electrode structure including successive layers of a gate electrode metal, a first insulator, and a silicide forming metal. A second insulator is formed along the edges of the electrode structure. A layer of polycrystalline silicon is deposited over essentially the entire transistor area and the silicide forming metal is reacted with the polycrystalline silicon so as to form a metal silicide over the electrode structure. The metal silicide is then selectively etched without affecting the first or second insulator or the remaining polycystalline silicon layer.

BRIEF DESCRIPTION OF THE DRAWING

These and other features of the invention are delineated in detail in the following description. In the drawing.

It will be appreciated that, for purpose of illustration, these figures are not necessarily drawn to scale.

DETAILED DESCRIPTION

FIGS. 1–11 illustrate various stages in the fabrication of a field effect transistor in accordance with one embodiment of the invention. It will be appreciated that the device shown is meant to illustrate only part of an integrated circuit which includes many other components.

Figure 1:
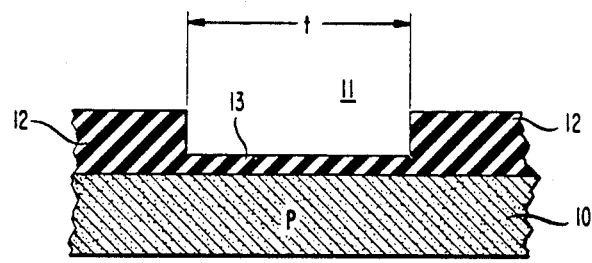
FIGS. 1–11 are views of a field effect transistor during various stages of fabrication in accordance with one embodiment of the invention.

As shown in FIG. 1, the processing begins with a silicon substrate, 10, which in this example is p-conductivity type, upon which is formed by standard techniques an insulating layer, 11, of $SiO_2$. The layer includes a thin portion, 13, formed over the area of the semiconductor which will comprise the transistor (typically referred to as the gate oxide) and a thick portion, 12, (the field oxide) which serves to mask the areas outside the transistor and to provide electrical isolation. The thin portions are typically 200 Å thick and the thick portions are typically 4000 Å thick. One of the advantages of the invention is the fact that the dimension, t, of the transistor area in the direction of current conduction (covered by 13) can be made small, i.e., typically less than 2 μm. That is, the dimension, t, of the region covered by 13 needs to be only large enough to contain the gate structure (14, 15, 16, 17, of FIG. 2) and provide allowance for a worst case alignment error between the gate and region 12.

Figure 2:
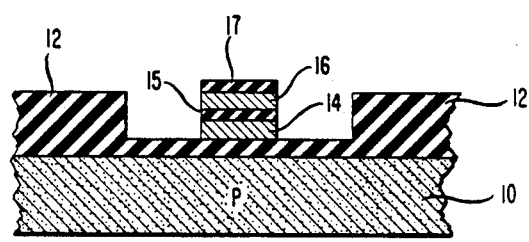
Figure 3:
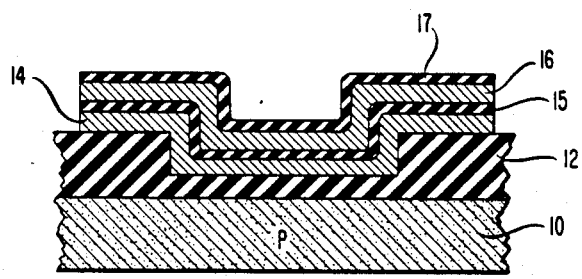

As illustrated in FIG. 2, a multi-level electrode structure is formed by standard deposition and photolithography over the area of the semiconductor which will comprise the channel region of the transistor. The structure comprises successive layers of a gate electrode metal, 14, such as polycrystalline silicon, an insulating layer, 15, such as $SiO_2$, and a silicide forming metal layer, 16, which in this example is palladium. Layer, 14, may, alternatively, comprise a composite layer of silicide, such as $TaSi_2$, on polycrystalline silicon. Formed on the metal layer, 16, is another insulating layer, 17, such as $SiO_2$ or $Si_3N_4$, which may be desirable to protect the metal, 16, from subsequent processing. FIG. 3 shows the same device in a cross-sectional view which is orthogonal to that of FIG. 2 in order to illustrate the fact that part of the electrode structure is formed over the steps between field oxide and gate oxide regions. Typical thicknesses are: 4000 Å for layer 14; 2000 Å for layer 15; 2000 Å for layer 16; and 2000 Å for layer 17. The electrode structure in this example measures approximately 1 μm laterally in FIG. 2 by approximately 1 μm high.

Figure 4:
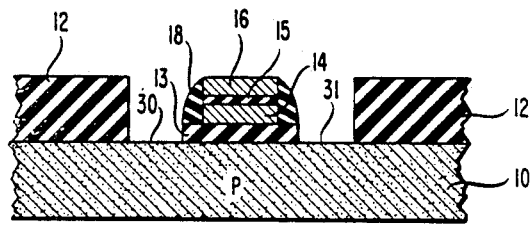
Figure 5:
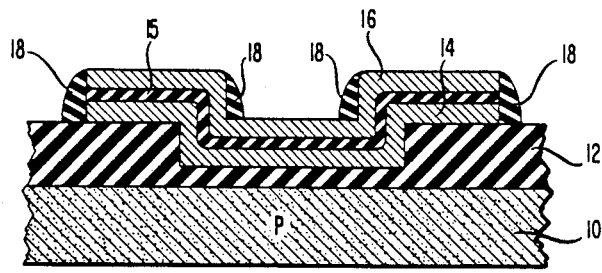

Next, as shown in FIGS. 4 and 5 (the latter beng a view orthogonal to that of FIG. 4), an insulating layer, 18, is formed on the edges of the electrode structure to offset the final gate structure from the contacts to be formed later. Several methods are available for forming this offset insulator. In this example, a layer of $SiO_2$ (not shown) is deposited over the entire structure to a thickness of approximately 1000 Å and is then etched anisotropically as by reactive ion etching. The etch is continued until the layer, 16, is exposed and also the portions of the gate oxide not covered by either the electrode structure or the vertical portions (18) of the $SiO_2$ layer are removed. The vertical portions (18) of the etched oxide remain due to the anisotropy of the etch. Layer 17 may be removed as part of the reactive ion etch (if, e.g., it is $SiO_2$) or in a separate wet etch (if, e.g., it is $Si_3N_4$). (It will be appreciated that sidewall oxide will also be formed on the walls of layer, 12, in FIG. 4 and subsequent figures thus slightly narrowing the original dimension t (by typically 0.1μ on each edge). This sidewall oxide is normally the same material as the initial oxide, 12, and is not shown in the figures.)

Figure 6:
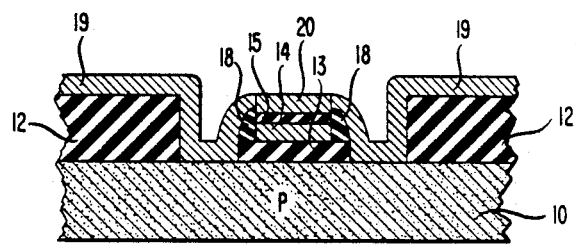

As shown in FIG. 6, a doped polycrystalline layer, 19, is then formed over essentially the entire structure. The layer may be doped either in situ during a chemical vapor deposition or by a later implant of the dopant. In this example, the layer is doped with arsenic (As) and deposited to a thickness of approximately 2000 Å by standard chemical vapor deposition at a temperature of approximately 600 degrees C. During such a reaction, the exposed Pd layer will react with the polycrystalline silicon to form a PdSi layer, 20.

Figure 7:
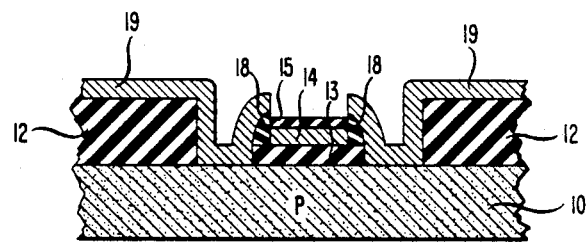
Figure 8:
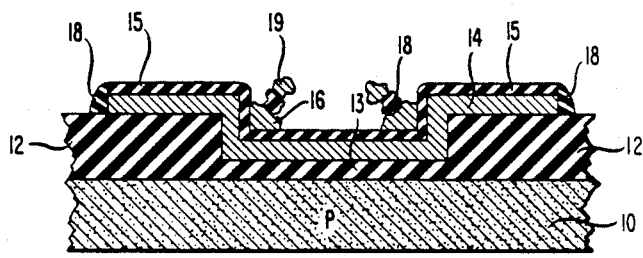

This silicide layer can be selectively etched without etching the remainder of the polycrystalline silicon layer, 19, or the $SiO_2$ layers, 15 and 18, as illustrated in FIG. 7 and in the orthogonal view of the same stage illustrated in FIG. 8. This can be accomplished, for example, by applying an etchant comprising a mixture of 12 gm $I_2$, 50 ml $H_2O$, 8 gm KI, and 25 ml KOH (1 normal). This step self-aligns the contacts since etching occurs only over the gate, and also removes the possibility of source-to-gate-to-drain shorts in the final device.

It will be noted in FIG. 8 that if the step between gate oxide and field oxide is essentially vertical, some portion of the palladium layer, 16, may be shielded from reaction with the polycrystalline silicon, 19, at the step. This can be easily remedied by applying an etchant, which removes the unreacted palladium and thereby also removes the overlying portions of the insulator, 18, and polycrystalline silicon, 19. One such etchant is $KI_3$ in methanol with approximately 7 percent by weight KI, 2 percent by weight $I_2$, and the reset methanol. Any processing which smooths the field oxide to gate oxide steps over which layer, 16, is deposited will eliminate the need for a special undercut etch of any unreacted metal. For example, the selective oxidation process for growing field oxide produces a shallow gate oxide to field oxide slope. Layer, 15, could also be a spin-on glass which will also produce a smoother profile onto which the metal is deposited.

Figure 9:
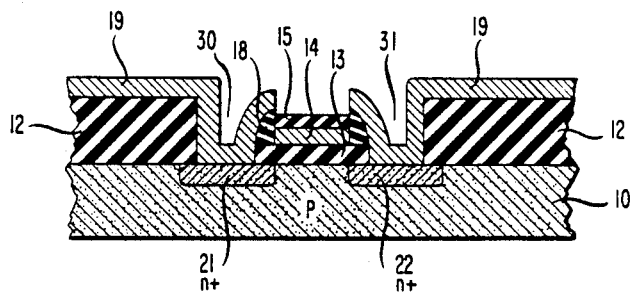

Next, as shown in FIG. 9, the As from the polycrystalline silicon, 19, may be diffused into the exposed semiconductor areas, 30 and 31, to form source and drain regions, 21 and 22, respectively. A typical heating step would be a temperature of approximately 950 degrees C. for approximately 30 min. It will be noted that the field oxide shields the semiconductor outside the transistor area from the diffusion. It will also be appreciated that the final junction depth of the source and drain regions will be established after all subsequent heat treatments.

Figure 10:
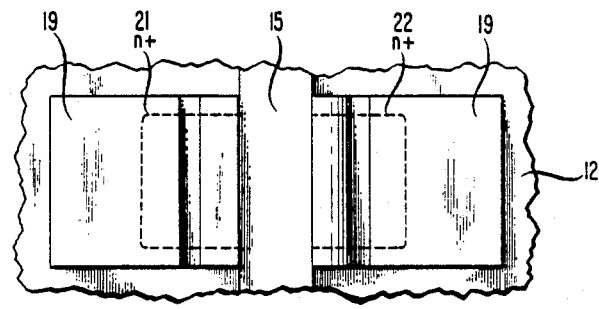

The polycrystalline silicon layer, 19, may then be patterned into desired dimensions by standard photolithography as illustrated in the top view of FIG. 10. It will be noted that the final pattern of the polycrystalline silicon layer extends over the field oxide portions adjacent to the source and drain regions, and also seals the source and drain regions from contaminants. The polycrystalline silicon layer, 19, may then be converted to a silicide layer (26 of FIG. 11) by depositing a metal, such as cobalt, and heating according to standing techniques. A typical heating step would be a temperature of 450 degrees C. for 30 min. in $H_2$, followed by 900 degrees C. for 30 min. in Ar with 2 percent $O_2$. The silicide layer would have the same geometry as the polycrystalline layer. If desired, the silicide layer could be formed prior to patterning the metal.

It will be appreciated that the use of silicide layer, 26, will lower series resistance between the contacts to source and drain regions and the channel since the layer, 26, is formed right up to the gate oxide, 13, and as close to the edges of the channel as possible. Although the entire polysilicon layer is converted to silicide in this example, it may also be desirable to so convert only a portion of the thickness of the layer so as to leave a multi-layer of polysilicon-silicide. In either case, the source and drain region vertical dimensions are not constricted by formation of silicide into the semiconductor. Further, the series resistance between source and drains and the channel can be optimized by controlling the relative thicknesses of the polysilicon and silicide layers without having to increase the source and drain junction depths.

Figure 11:
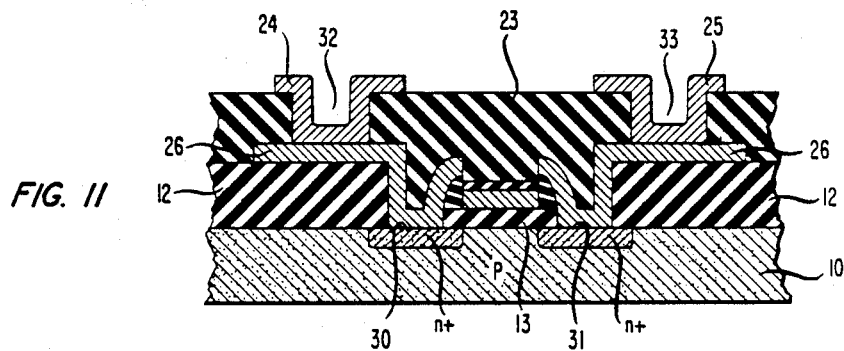

In the final sequence of steps, as shown in FIG. 11, the device is covered by a layer, 23, such as phosphorus-doped glass, the surface is planarized, and windows, 32 and 33, are opened therein by standard photolithography to expose portions of the layer, 26. Contact is made to the source and drain through the silicide layer, 26, by depositing a contact metal such as aluminum, 24 and 25, in the windows. It will be noted that ohmic contact is made over the field oxide portions rather than directly over the source and drain regions. This feature provides several advantages. First, it permits the source and drain silicide contact areas, 30 and 31, to be made small (desirably, no greater than 0.5 μm) since the aluminum contact windows, 32 and 33, do not have to be aligned therewith. Second, it eliminates the problems of spiking between the aluminum and silicon substrate. Further, it also simplifies etching since the contacts, 24 and 25, to the source and drain are at approximately the same height as the contact to the gate electrode (not shown). This eliminates window growth (or "blooming") problems which can otherwise occur for windows to gate electrodes which are exposed to overetching while the windows to the source and drain are continuing to be etched. It will also be appreciated that a required overlapping of layer, 26, around the window is not necessary, since, even with a misalignment, there should be very little overretching required when all window depths are the same. It will also be noted that, although the metal contacts, 24 and 25, are shown overlapping the contact windows, 24 and 25, this overlap is also not necessary. Lay-out area can thereby be reduced. Finally, it may be noted that forming the contact over the field oxide reduces the depth of the windows, 32 and 33, and therefore improves the step coverage of the Al metal.

It will be realized that several modifications of the invention are possible. For example, the particular materials described are intended to be primarily illustrative and other materials which function in the same way may be substituted. All conductivity types shown may be reversed. Although an enhancement mode device has been illustrated, the invention is applicable to all types of field effect transistors. Although self-aligned removal of polysilicon above the gate is achieved in the above example by initially patterning a multi-level electrode structure, other methods might be employed. For example, a polysilicon gate could be defined in a standard manner and, subsequent to forming the sidewall oxide, a silicide-forming metal could be selectively plated or deposited by chemical vapor deposition over the gate electrode. The polysilicon layer, 19, could then be deposited and the silicide formed as before. Thus, in the attached claims, unless otherwise indicated, formation of a multilevel electrode structure including a silicide-forming metal need not be done sequentially before other recited steps. Useful silicide-forming metals, in addition to palladium, include nickel, tungsten, and tantalum.

Further, selective removal of the portion of the polysilicon layer, 19, over the gate electrode could be achieved by an alternative technique using different levels of doping in the polysilicon layer. For example, the top layer, 16, can be a layer with a suitable dopant, such as polysilicon doped with phosphorous. Layer, 19, could then be deposited as an undoped layer. The structure could then be heated for a time and temperature sufficient to diffuse the dopant from layer 16 to the portion of the layer 19 formed thereon. A selective etch, such as a wet chemical or reactive sputter etch, can preferentially remove the doped portion of layer 19 to give essentially the same structure as shown in FIG. 7. The remainder of layer 19 can then be either doped or converted to silicide to provide the necessary conductivity for electrical contact with the semiconductor.

Various additional modifications of the invention will become apparent to those skilled in the art. All such variations which basically relay on the teachings through which the invention has advanced the art are properly considered within the spirit and scope of the invention.

What is claimed is:

1. A method of fabricating a field effect transistor including a source and drain region formed in the surface of a semiconductor substrate with a channel region therebetween, the method comprising the steps of:
    forming over the channel region a multi-level electrode structure including a gate electrode metal;
    forming an insulator along the edges of at least the gate electrode metal;
    depositing a layer of polycrystalline silicon over essentially the entire transistor area;
    rendering the portion of the polycrystalline silicon layer over the gate electrode selectively removable; and
    selectively removing the said portion of the polycrystalline layer.

2. The method according to claim 1 wherein the multi-level electrode structure includes a top layer which is a material including a dopant impurity and the portion of the polysilicon is rendered selectively removable by diffusion of the dopant into the said portion of the polycrystalline layer.

3. The method according to claim 2 wherein the top layer comprises a polycrystalline layer doped with phosphorous.

* * * * *